United States Patent [19]
Dell et al.

[11] Patent Number: 5,513,135
[45] Date of Patent: Apr. 30, 1996

[54] SYNCHRONOUS MEMORY PACKAGED IN SINGLE/DUAL IN-LINE MEMORY MODULE AND METHOD OF FABRICATION

[75] Inventors: Timothy J. Dell, Colchester; Lina S. Farah, Burlington; George C. Feng; Mark W. Kellogg, both of Essex Junction, all of Vt.

[73] Assignee: International Business Machines Corporation, Armonk, N.Y.

[21] Appl. No.: 349,154

[22] Filed: Dec. 2, 1994

[51] Int. Cl.⁶ ............................................. G11C 5/06
[52] U.S. Cl. ........................................ 365/52; 365/63
[58] Field of Search ..................... 365/52, 63, 230.03, 365/51

[56] References Cited

U.S. PATENT DOCUMENTS

| | | | |
|---|---|---|---|
| 4,656,605 | 4/1987 | Clayton | 365/52 |
| 4,727,513 | 2/1988 | Clayton | 365/52 |
| 4,850,892 | 7/1989 | Clayton et al. | 439/326 |
| 4,916,603 | 4/1990 | Ryan et al. | 364/200 |
| 4,994,936 | 2/1991 | Hernandez | 361/306 |
| 5,089,993 | 2/1992 | Neal et al. | 365/63 |
| 5,164,916 | 11/1992 | Wu et al. | 365/52 |
| 5,237,536 | 8/1993 | Ohtsuki | 365/230.06 |
| 5,270,964 | 12/1993 | Bechtolsheim et al. | 365/52 |
| 5,272,664 | 12/1993 | Alexander et al. | 365/52 |
| 5,307,309 | 4/1994 | Protigal et al. | 365/63 |

OTHER PUBLICATIONS

"Configurations for Solid State Memories" (JEDEC Standard No. 21–C, Release 5), 1995, pp. 3.9.5–11, 4–6B, 4–37–4–38.
Bursky, D., Synchronous DRAMs Clock at 100 MHz, Electronic Design, pp. 45–49, Feb. 1993.
PowerPC, Advance Information—MPC105 PCI Bridge/Memory Controller Technical Summary, Motorola, Inc., pp. 1–20, 1994.

*Primary Examiner*—David C. Nelms
*Assistant Examiner*—Son Dinh
*Attorney, Agent, or Firm*—Heslin & Rothenberg

[57] ABSTRACT

Multiple synchronous dynamic random access memories (SDRAMs) are packaged in a single or a dual in-line memory module to have similar physical and architectural characteristics of dynamic random access memories (DRAMs) packaged in single/dual in-line memory modules. A 168 pin SDRAM DIMM family is presented which requires no modification of existing connector, planar or memory controller components. The 168 pin SDRAM DIMM family includes 64 bit non-parity, 72 bit parity, 72 bit ECC and 80 bit ECC memory organizations. Special placement and wiring of decoupling capacitors about the SDRAMs and the buffer chips contained within the module are also presented to reduce simultaneous switching noises during read and write operations. A special wiring scheme for the decoupling capacitors is employed to reduce wiring inductance.

25 Claims, 13 Drawing Sheets

| 168 PIN DIMM PINOUT: LEFT SIDE ||||||||||
| FRONT SIDE |||| BACK SIDE |||||
| | PARITY || ECC | | PARITY || ECC ||
| PIN # | x64 | x72 PARITY | x72 ECC | x80 ECC | PIN # | x64 | x72 PARITY | x72 ECC | x80 ECC |
| --- | --- | --- | --- | --- | --- | --- | --- | --- | --- |
| 1 | Vss | Vss | Vss | Vss | 85 | Vss | Vss | Vss | Vss |
| 2 | DQ0 | DQ0 | DQ0 | DQ0 | 86 | DQ36 | DQ36 | DQ36 | DQ40 |
| 3 | DQ1 | DQ1 | DQ1 | DQ1 | 87 | DQ37 | DQ37 | DQ37 | DQ41 |
| 4 | DQ2 | DQ2 | DQ2 | DQ2 | 88 | DQ38 | DQ38 | DQ38 | DQ42 |
| 5 | DQ3 | DQ3 | DQ3 | DQ3 | 89 | DQ39 | DQ39 | DQ39 | DQ43 |
| 6 | Vcc | Vcc | Vcc | Vcc | 90 | Vcc | Vcc | Vcc | Vcc |
| 7 | DQ4 | DQ4 | DQ4 | DQ4 | 91 | DQ40 | DQ40 | DQ40 | DQ44 |
| 8 | DQ5 | DQ5 | DQ5 | DQ5 | 92 | DQ41 | DQ41 | DQ41 | DQ45 |
| 9 | DQ6 | DQ6 | DQ6 | DQ6 | 93 | DQ42 | DQ42 | DQ42 | DQ46 |
| 10 | DQ7 | DQ7 | DQ7 | DQ7 | 94 | DQ43 | DQ43 | DQ43 | DQ47 |
| 11 | RFU | DQ8 | DQ8 | DQ8 | 95 | RFU | DQ44 | DQ44 | DQ48 |
| 12 | Vss | Vss | Vss | Vss | 96 | Vss | Vss | Vss | Vss |
| 13 | DQ9 | DQ9 | DQ9 | DQ9 | 97 | DQ45 | DQ45 | DQ45 | DQ49 |
| 14 | DQ10 | DQ10 | DQ10 | DQ10 | 98 | DQ46 | DQ46 | DQ46 | DQ50 |
| 15 | DQ11 | DQ11 | DQ11 | DQ11 | 99 | DQ47 | DQ47 | DQ47 | DQ51 |
| 16 | DQ12 | DQ12 | DQ12 | DQ12 | 100 | DQ48 | DQ48 | DQ48 | DQ52 |
| 17 | DQ13 | DQ13 | DQ13 | DQ13 | 101 | DQ49 | DQ49 | DQ49 | DQ53 |
| 18 | Vcc | Vcc | Vcc | Vcc | 102 | Vcc | Vcc | Vcc | Vcc |
| 19 | DQ14 | DQ14 | DQ14 | DQ14 | 103 | DQ50 | DQ50 | DQ50 | DQ54 |
| 20 | DQ15 | DQ15 | DQ15 | DQ15 | 104 | DQ51 | DQ51 | DQ51 | DQ55 |
| 21 | DQ16 | DQ16 | DQ16 | DQ16 | 105 | DQ52 | DQ52 | DQ52 | DQ56 |
| 22 | RFU | DQ17 | DQ17 | DQ17 | 106 | RFU | DQ53 | DQ53 | DQ57 |
| 23 | Vss | Vss | Vss | Vss | 107 | Vss | Vss | Vss | Vss |
| 24 | RFU | RFU | RFU | DQ18 | 108 | RFU | RFU | RFU | DQ58 |
| 25 | RFU | RFU | RFU | DQ19 | 109 | RFU | RFU | RFU | DQ59 |
| 26 | Vcc | Vcc | Vcc | Vcc | 110 | Vcc | Vcc | Vcc | Vcc |
| 27 | WE0 | WE0 | WE0 | WE0 | 111 | RFU | RFU | RFU | RFU |
| 28 | CE0 | CE0 | CE0 | CE0 | 112 | CE1 | CE1 | CE1 | CE1 |
| 29 | CE2 | CE2 | RFU | RFU | 113 | CE3 | CE3 | RFU | RFU |
| 30 | RE0 | RE0 | RE0 | RE0 | 114 | RE1 | RE1 | RE1 | RE1 |
| 31 | OE0 | OE0 | OE0 | OE0 | 115 | RFU | RFU | RFU | RFU |
| 32 | Vss | Vss | Vss | Vss | 116 | Vss | Vss | Vss | Vss |
| 33 | A0 | A0 | A0 | A0 | 117 | A1 | A1 | A1 | A1 |
| 34 | A2 | A2 | A2 | A2 | 118 | A3 | A3 | A3 | A3 |
| 35 | A4 | A4 | A4 | A4 | 119 | A5 | A5 | A5 | A5 |
| 36 | A6 | A6 | A6 | A6 | 120 | A7 | A7 | A7 | A7 |
| 37 | A8 | A8 | A8 | A8 | 121 | A9 | A9 | A9 | A9 |
| 38 | A10 | A10 | A10 | A10 | 122 | A11 | A11 | A11 | A11 |
| 39 | A12 | A12 | A12 | A12 | 123 | A13 | A13 | A13 | A13 |
| 40 | Vcc | Vcc | Vcc | Vcc | 124 | Vcc | Vcc | Vcc | Vcc |
| 41 | RFU | RFU | RFU | RFU | 125 | RFU | RFU | RFU | RFU |
| 42 | RFU | RFU | RFU | RFU | 126 | B0 | B0 | B0 | B0 | fig. 2A

| 168 PIN DIMM PINOUT: RIGHT SIDE ||||||||| 
| FRONT SIDE |||| BACK SIDE ||||
| | PARITY | ECC || | PARITY | ECC ||
| PIN # | x64 | x72 PARITY | x72 ECC | x80 ECC | PIN # | x64 | x72 PARITY | x72 ECC | x80 ECC |
|---|---|---|---|---|---|---|---|---|---|
| 43 | Vss | Vss | Vss | Vss | 127 | Vss | Vss | Vss | Vss |
| 44 | OE2 | OE2 | OE2 | OE2 | 128 | RFU | RFU | RFU | RFU |
| 45 | RE2 | RE2 | RE2 | RE2 | 129 | RE3 | RE3 | RE3 | RE3 |
| 46 | CE4 | CE4 | CE4 | CE4 | 130 | CE5 | CE5 | CE5 | CE5 |
| 47 | CE6 | CE6 | RFU | RFU | 131 | CE7 | CE7 | RFU | RFU |
| 48 | WE2 | WE2 | WE2 | WE2 | 132 | PDE | PDE | PDE | PDE |
| 49 | Vcc | Vcc | Vcc | Vcc | 133 | Vcc | Vcc | Vcc | Vcc |
| 50 | RFU | RFU | RFU | DQ20 | 134 | RFU | RFU | RFU | DQ60 |
| 51 | RFU | RFU | RFU | DQ21 | 135 | RFU | RFU | RFU | DQ61 |
| 52 | DQ18 | DQ18 | DQ18 | DQ22 | 136 | DQ54 | DQ54 | DQ54 | DQ62 |
| 53 | DQ19 | DQ19 | DQ19 | DQ23 | 137 | DQ55 | DQ55 | DQ55 | DQ63 |
| 54 | Vss | Vss | Vss | Vss | 138 | Vss | Vss | Vss | Vss |
| 55 | DQ20 | DQ20 | DQ20 | DQ24 | 139 | DQ56 | DQ56 | DQ56 | DQ64 |
| 56 | DQ21 | DQ21 | DQ21 | DQ25 | 140 | DQ57 | DQ57 | DQ57 | DQ65 |
| 57 | DQ22 | DQ22 | DQ22 | DQ26 | 141 | DQ58 | DQ58 | DQ58 | DQ66 |
| 58 | DQ23 | DQ23 | DQ23 | DQ27 | 142 | DQ59 | DQ59 | DQ59 | DQ67 |
| 59 | Vcc | Vcc | Vcc | Vcc | 143 | Vcc | Vcc | Vcc | Vcc |
| 60 | DQ24 | DQ24 | DQ24 | DQ28 | 144 | DQ60 | DQ60 | DQ60 | DQ68 |
| 61 | RFU | RFU | RFU | RFU | 145 | RFU | RFU | RFU | RFU |
| 62 | RFU | RFU | RFU | RFU | 146 | RFU | RFU | RFU | RFU |
| 63 | RFU | RFU | RFU | RFU | 147 | RFU | RFU | RFU | RFU |
| 64 | RFU | RFU | RFU | RFU | 148 | RFU | RFU | RFU | RFU |
| 65 | DQ25 | DQ25 | DQ25 | DQ29 | 149 | DQ61 | DQ61 | DQ61 | DQ69 |
| 66 | RFU | DQ26 | DQ26 | DQ30 | 150 | RFU | DQ62 | DQ62 | DQ70 |
| 67 | DQ27 | DQ27 | DQ27 | DQ31 | 151 | DQ63 | DQ63 | DQ63 | DQ71 |
| 68 | Vss | Vss | Vss | Vss | 152 | Vss | Vss | Vss | Vss |
| 69 | DQ28 | DQ28 | DQ28 | DQ32 | 153 | DQ64 | DQ64 | DQ64 | DQ72 |
| 70 | DQ29 | DQ29 | DQ29 | DQ33 | 154 | DQ65 | DQ65 | DQ65 | DQ73 |
| 71 | DQ30 | DQ30 | DQ30 | DQ34 | 155 | DQ66 | DQ66 | DQ66 | DQ74 |
| 72 | DQ31 | DQ31 | DQ31 | DQ35 | 156 | DQ67 | DQ67 | DQ67 | DQ75 |
| 73 | Vcc | Vcc | Vcc | Vcc | 157 | Vcc | Vcc | Vcc | Vcc |
| 74 | DQ32 | DQ32 | DQ32 | DQ36 | 158 | DQ68 | DQ68 | DQ68 | DQ76 |
| 75 | DQ33 | DQ33 | DQ33 | DQ37 | 159 | DQ69 | DQ69 | DQ69 | DQ77 |
| 76 | DQ34 | DQ34 | DQ34 | DQ38 | 160 | DQ70 | DQ70 | DQ70 | DQ78 |
| 77 | RFU | DQ35 | DQ35 | DQ39 | 161 | RFU | DQ71 | DQ71 | DQ79 |
| 78 | Vss | Vss | Vss | Vss | 162 | Vss | Vss | Vss | Vss |
| 79 | PD1 | PD1 | PD1 | PD1 | 163 | PD2 | PD2 | PD2 | PD2 |
| 80 | PD3 | PD3 | PD3 | PD3 | 164 | PD4 | PD4 | PD4 | PD4 |
| 81 | PD5 | PD5 | PD5 | PD5 | 165 | PD6 | PD6 | PD6 | PD6 |
| 82 | PD7 | PD7 | PD7 | PD7 | 166 | PD8 | PD8 | PD8 | PD8 |
| 83 | ID0 | ID0 | ID0 | ID0 | 167 | ID1 | ID1 | ID1 | ID1 |
| 84 | Vcc | Vcc | Vcc | Vcc | 168 | Vcc | Vcc | Vcc | Vcc |

*fig. 2B*

168 PIN SDRAM DIMM

| PIN NAME | #PINS | PIN FUNCTION |
|---|---|---|
| A0–A13 | 14 | ADDRESS INPUT |
| DQ0–DQ79 | 80 | DATA IN/DATA OUT |
| CS0–CS4 | 4 | CHIP SELECT |
| WE0 | 1 | WRITE ENABLE |
| CLK0, CLK1 | 2 | CLOCK |
| CKE | 1 | CLOCK ENABLE |
| Vref | 2 | POWER SUPPLY FOR REFERENCE |
| Vcc | 17 | POWER SUPPLY |
| Vss | 18 | GROUND |
| PD | 9 | PRESENCE DETECT |
| ID | 4 | DIMM ID BIT |
| SCAS | 1 | SYNCHRONOUS COLUMN ADDRESS STROBE |
| SRAS | 1 | SYNCHRONOUS ROW ADDRESS STROBE |
| PDE | 1 | PRESENCE DETECT ENABLE |
| DQM | 4 | DATA INPUT/OUTPUT MASK |
| (DQMB) | (8) | (DATA INPUT/OUTPUT MASK BYTE) |
| RFU | 1 | RESERVED FOR FUTURE USE |
| DU | 4 | DON'T USE |

*fig. 3*

| 168 PIN SDRAM DIMM – CHANGES FROM 168 PIN DRAM DIMM ||||||
|---|---|---|---|---|---|
| PIN# | DRAM PIN ASSIGNMENT | X64 NON-PARITY | X72 PARITY | X72 ECC | X80 ECC |
| 28 | CE0 | DQMB0 | DQMB0 | DQM0 | DQM0 |
| 29 | CE2 | DQMB2 | DQMB2 | RFU | RFU |
| 30 | RE0 | CS0 | CS0 | CS0 | CS0 |
| 31 | OE0 | DU | DU | DU | DU |
| 41 | RFU | Vcc | Vcc | Vcc | Vcc |
| 42 | RFU | CLK0 | CLK0 | CLK0 | CLK0 |
| 44 | OE2 | DU | DU | DU | DU |
| 45 | RE2 | CS2 | CS2 | CS2 | CS2 |
| 46 | CE4 | DQMB4 | DQMB4 | DQM4 | DQM4 |
| 47 | CE6 | DQMB6 | DQMB6 | RFU | RFU |
| 48 | WE2 | DU | DU | DU | DU |
| 61 | RFU | PD9 | PD9 | PD9 | PD9 |
| 62 | RFU | Vref | Vref | Vref | Vref |
| 63 | RFU | ID2 | ID2 | ID2 | ID2 |
| 64 | RFU | Vss | Vss | Vss | Vss |
| 111 | RFU | SCAS | SCAS | SCAS | SCAS |
| 112 | CE1 | DQMB1 | DQMB1 | DQM1 | DQM1 |
| 113 | CE3 | DQMB3 | DQMB3 | RFU | RFU |
| 114 | RE1 | CS1 | CS1 | CS1 | CS1 |
| 115 | RFU | SRAS | SRAS | SRAS | SRAS |
| 125 | RFU | CLK1 | CLK1 | CLK1 | CLK1 |
| 126 | B0 | RFU | RFU | RFU | RFU |
| 128 | RFU | CKE | CKE | CKE | CKE |
| 129 | RE3 | CS3 | CS3 | CS3 | CS3 |
| 130 | CE5 | DQMB5 | DQMB5 | DQM5 | DQM5 |
| 131 | CE7 | DQMB7 | DQMB7 | RFU | RFU |
| 146 | RFU | Vref | Vref | Vref | Vref |
| 147 | RFU | ID3 | ID3 | ID3 | ID3 |
| 148 | RFU | Vss | Vss | Vss | Vss |

*fig. 4*

$\overline{SRAS}$ ⟶▷⟶ $\overline{RAS}$: SDRAMS D0–D15

$\overline{SCAS}$ ⟶▷⟶ $\overline{CAS}$: SDRAMS D0–D15

A0–AN ⟶▷⟶ A0–AN: SDRAMS D0–D15

CKE ⟶▷⟶ CKE: SDRAMS D0–D15

$V_{CC}$ ⟶ D0–D15

$V_{SS}$ ⟶ D0–D15

CLK0 ⟶ CLK: SDRAMS D0–D7

CLK1 ⟶ CLK: SDRAMS D8–D15

*fig. 6*

$\overline{SRAS}$ ─▷─→ $\overline{RAS}$: SDRAMS D0–D19
$\overline{SCAS}$ ─▷─→ $\overline{CAS}$: SDRAMS D0–D19

A0–AN ─▷─→ A0–AN: SDRAMS D0–D19
CKE ─▷─→ CKE: SDRAMS D0–D19

$V_{CC}$ ─●─→ D0–D19
        ═
$V_{SS}$ ─●─→ D0–D19

CLK0 ─●─→ CLK: SDRAMS D0–D9
     ⋛
     ⏚

CLK1 ─●─→ CLK: SDRAMS D10–D19
     ⋛
     ⏚

*fig. 11*

SYNCHRONOUS MEMORY PACKAGED IN SINGLE/DUAL IN-LINE MEMORY MODULE AND METHOD OF FABRICATION

TECHNICAL FIELD

The present invention relates generally to the field of computer memory, and more particularly, to multiple synchronous dynamic random access memories packaged in a single or a dual in-line memory module and to methods for fabricating the same.

BACKGROUND ART

In recent years, the freefall of processor cycle times to levels well below access times of most dynamic random access memories has generated extensive research, the result of which has been formation of synchronous memory devices. Virtually all currently available semiconductor dynamic random access memory (DRAM) and many static random access memory (SRAM) devices use asynchronous clocking systems in that the clocking signals necessary to perform memory access functions are not synchronized to the associated system processor. Although memories are accessed by signals sent by the processor, the exact time interval between the time a request is sent to a memory and the time a response is received is dependent on the particular internal features of the memory. Thus, it is necessary for system designers to allow for the "worst case" response time between requests for information and the anticipated time the information will be available, which necessarily wastes time in the handling of many memory functions.

Semiconductor processing technology has enabled logic components such as microprocessors to operate at, for example, 66–100 megahertz (Mhz) clock rates. Until recently, memory system clock rates have not kept pace because of the nature of operations performed. In order to meet these higher speed processors, synchronous dynamic random access memories (SDRAMs), operable with clock rates of up to 66–100 Mhz., have been designed. SDRAMs are responsive to a high frequency clock signal generated by the processor, or at least in synchronization with the processor, which renders all internal activity within the memory "synchronous" with other devices responsive to the same clock signal(s). In the synchronous approach, all SDRAM inputs are sampled at the positive edge of the input clock, and all SDRAM outputs are valid on subsequent positive edges. This technique permits input/output transactions to take place on every clock cycle. SDRAMs can simplify both the overall system design and the memory-management subsystem, because the main memory no longer has to be asynchronous to the system clock.

Packaging of multiple SDRAM devices is one particular problem to be addressed with the emergence of this new technology. In general, the synchronous memory chip contains a standard DRAM array core plus many of the same features included in a standard DRAM. However, in addition to row and column decoders, and a refresh counter, such devices incorporate special latency and burst-length registers, a data-input register, and programming and timing registers. These new SDRAM registers also require that system designers accommodate a few new signal lines, for example, clock and clock enable lines, as well as data input/output mask control lines.

Single in-line memory modules (SIMMs) are compact circuit boards designed to accommodate surface mounted memory chips, such as DRAMs. SIMMs were developed to provide compact and easy-to-manage modular memory components for user installation in computer systems designed to accept such SIMMs. A SIMM generally is easily inserted into a connector within the computer system, the SIMM thereby deriving all necessary power, ground, and logic signals therefrom. Recently, dual in-line memory modules (DIMMs) have begun to replace SIMMs as the compact circuit boards of preference. A DIMM essentially comprises a SIMM wherein memory chips are surface mounted to opposite sides of the circuit board, and the connector tabs are unique on each side. The industry has standardized a 168 pin DIMM design for dynamic random access memories. The 168 pin 8 byte DIMM family has been developed as an optimized low cost main memory solution for 4 and 8 byte processor applications. The family includes 64 bit non-parity, 72 bit parity, 72 bit ECC, and 80 bit ECC memory organizations. A significant portion of the connectors, motherboards, etc., presently marketed for DIMM packages are configured to accommodate this 168 pin configuration for main memory.

There is currently activity in the semiconductor packaging industry to design a low cost DIMM to fully utilize the high speed synchronous dynamic random access memories. The industry is currently discussing the implementation of a new 200 pin DIMM to accommodate the extra signals required to drive synchronous DRAMs. However, this new design will also require reconfiguration of the connector, motherboard, etc., into which the 200 pin DIMM would be inserted, along with occupying greater area. Because of the wide acceptance of the 168 pin DIMM outline, the reduced space required thereof and the benefits of being able to design a common motherboard for both DRAM and SDRAM applications, implementation of SDRAMs in a 168 pin DIMM is believed clearly preferential.

DISCLOSURE OF INVENTION

Briefly summarized, the present invention comprises in one aspect a dual in-line memory module (DIMM) which includes a printed circuit board having a front side and a back side and 168 connector pin locations. Multiple synchronous dynamic random access memories (SDRAMs) are mounted on the front side and the back side of the printed circuit board. Connecting means are provided for electrically connecting the multiple SDRAMs to the 168 connector pin locations such that a functional DIMM is defined containing SDRAMs.

In another aspect, the invention comprises a dual in-line memory module having a first set of memory elements and a second set of memory elements arranged on a first side and a second side, respectively, of a printed circuit board. The printed circuit board also includes a connector edge having a plurality of electrical contacts accessible from either the first side or the second side of the printed circuit board. At least some of the first memory elements and at least some of the second memory elements have data lines and control lines coupled to selected electrical contacts of the plurality of electrical contacts on the connector edge. A plurality of first capacitive means and a plurality of second capacitive means are associated with the at least some first memory elements and at least some second memory elements having data lines and control lines coupled to the selected electrical contacts such that each of these memory elements has both a first capacitive means and a second capacitive means associated therewith. The associated first capacitive means is disposed and connected to function as a data line decoupling capacitor and the associated second capacitive means is disposed and connected to function as a control line decoupling capacitor.

In still another aspect, the invention comprises a method for defining an "x" pin dual in-line memory module (DIMM) for synchronous dynamic random access memories (SDRAMs) from a standard "x" pin DIMM for dynamic random access memories (DRAMs) having column enable (CE) and row enable (RE) pins. The method includes the steps of: reassigning column enable (CE) pins and row enable (RE) pins of the "x" pin DRAM DIMM to data input/output mask (DQM) pins and column select (CS) pins, respectively; reassigning at least one pin of the "x" pin DRAM DIMM to comprise a synchronous clock (CLK) pin; and reassigning at least one pin of the "x" pin DRAM DIMM to comprise a synchronous column address strobe (SCAS) pin and one pin of the "x" pin DRAM DIMM to comprise a synchronous row address strobe (SRAS) pin. Upon completion of the steps, a functional "x" pin SDRAM DIMM layout is defined from the standard "x" pin DRAM DIMM.

To restate, this invention comprises in all aspects a memory module and fabrication method for accommodating multiple synchronous memories in an in-line memory module that is physically and architecturally compatible with conventional memory modules containing multiple asynchronous memories, such as DRAMs. With compatibility, a 168 pin SDRAM DIMM can be substituted for a conventional 168 pin DRAM DIMM without any requirement that the connector, planar or memory controller be modified beyond structures presently commercially available. Thus, a quantum jump in memory module performance can be attained by substituting SDRAMs for DRAMs, with only a minor increase in cost.

Additionally, structures are presented herein which have a pair of decoupling capacitors for each chip in the memory module for improved decoupling capacitance. A first capacitor is configured to decouple data lines, while a second capacitor of the pair is configured to decouple control lines and internal chip circuitry. Further, wire inductance is lowered in the lines connecting the decoupling capacitors to the respective power and ground planes by provision of wide width lines each of which contacts the respective plane through multiple via openings. Lower noise and better performance can also be obtained by disposing power and ground connector pins adjacent to the synchronous clock pin(s), and positioning the two synchronous clock pins in the middle of the pin-out arrays. A family of high performance, low cost SDRAM DIMMs is presented. Also, the concepts disclosed herein are equally applicable to single in-line memory modules (SIMMs).

BRIEF DESCRIPTION OF DRAWINGS

These and other objects, advantages and features of the present invention will be more readily understood from the following detailed description of certain preferred embodiments of the invention, when considered in conjunction with the accompanying drawings in which:

FIGS. 2a & 2b are tables of one conventional pin-out configuration for a 168 DIMM design for dynamic random access memories (DRAMs) for 64 bit non-parity, 72 bit parity, 72 bit ECC, and 80 bit ECC memory organizations;

FIG. 3 is a pin name description table for a 168 pin DIMM design for SDRAMs in accordance with the present invention;

FIG. 4 is a table presenting one embodiment of pin-out changes from the 168 pin DIMM design for DRAMs of FIGS. 2a & 2b to a 168 pin DIMM design for SDRAMs, again for the 8 byte DIMM family of 64 bit non-parity, 72 bit parity, 72 bit ECC and 80 bit ECC memory configurations;

FIG. 6 schematically depicts additional pin-outs of a 64 bit SDRAM DIMM and a 72 bit parity SDRAM DIMM in accordance with the present invention;

FIG. 11 schematically depicts additional pin-outs for the 80 bit ECC SDRAM DIMM of FIG. 10.

BEST MODE FOR CARRYING OUT THE INVENTION

A memory module is disclosed herein containing multiple synchronous memories which is physically similar and architecturally compatible with a conventional memory module containing multiple asynchronous memories. In the following description, for purposes of explanation, implementation of a dual in-line memory module (DIMM) containing multiple synchronous memories is set forth. However, the invention is equally applicable to single in-line memory modules (SIMMs), and the appended claims are intended to encompass such an application. Along with the advantage of compatibility, a memory module of synchronous memory in accordance with the present invention preferably employs special placement and wiring of decoupling capacitors about the synchronous memories to reduce simultaneous switching noise during read and write operations.

Figure 1:
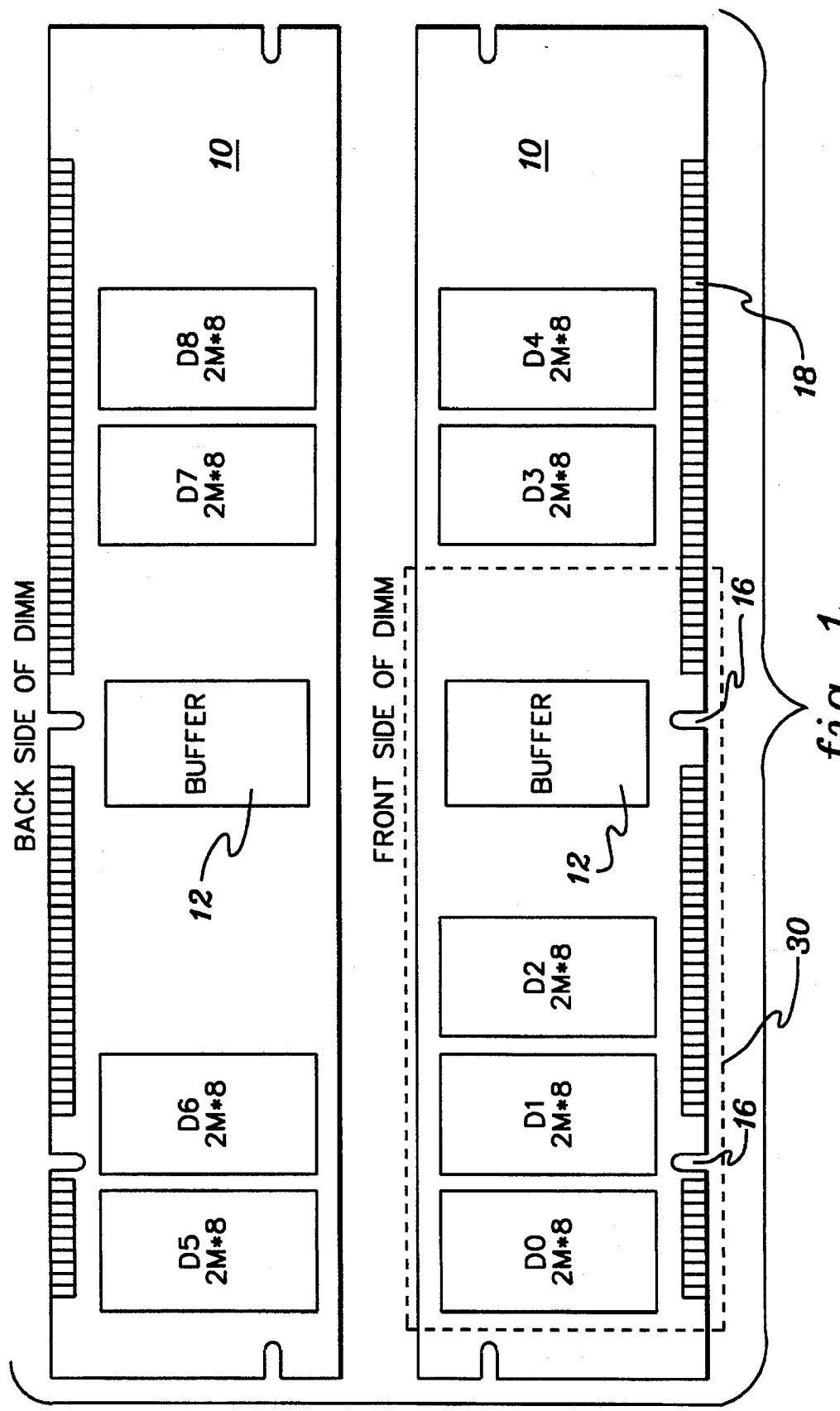
FIG. 1 is a block diagram of a 168 pin dual in-line memory module (DIMM) designed in accordance with the present invention for synchronous dynamic random access memories (SDRAMs)
Figure 5:
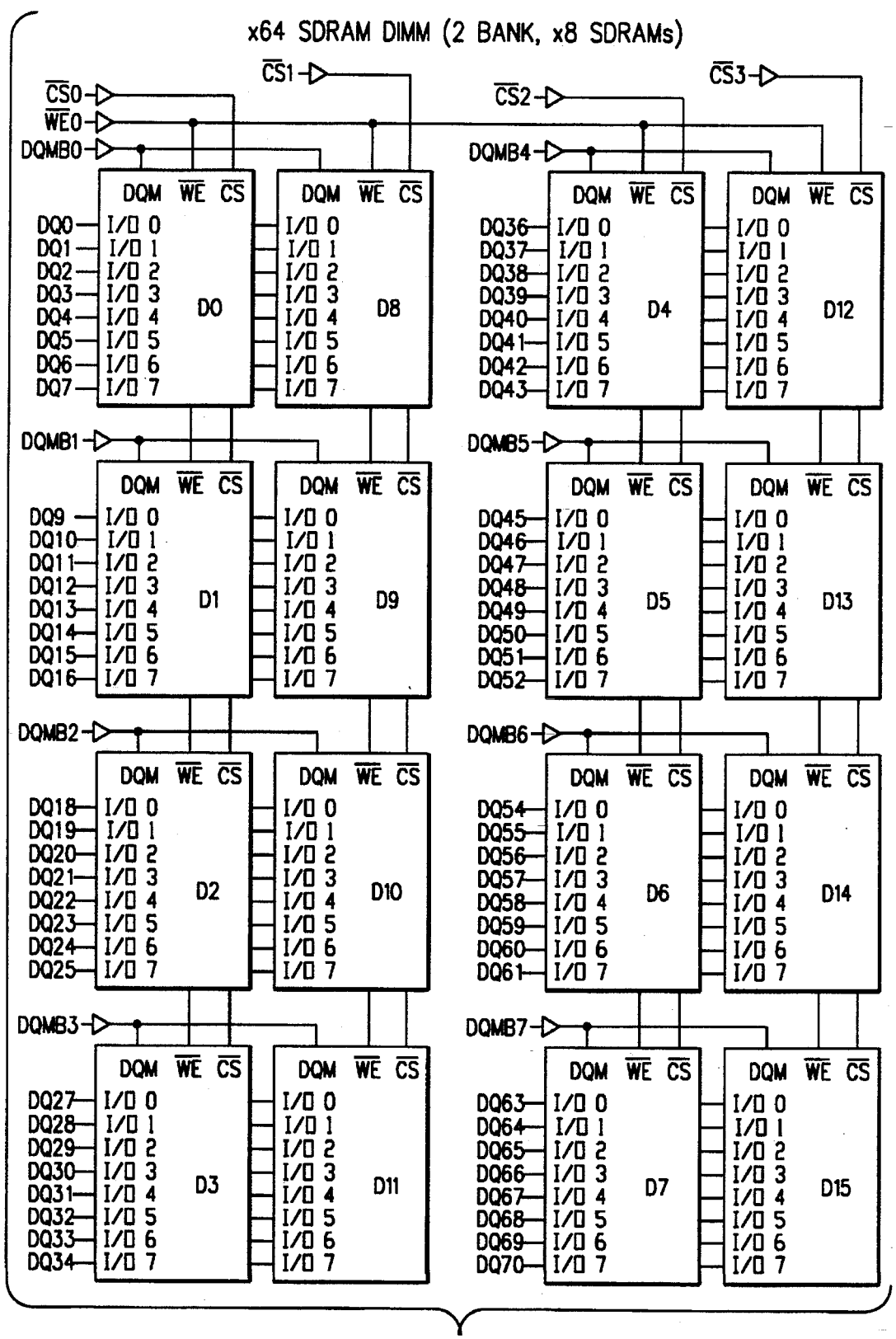
FIG. 5 is a schematic of one embodiment of a 64 bit SDRAM DIMM in accordance with the present invention.
Figure 7:
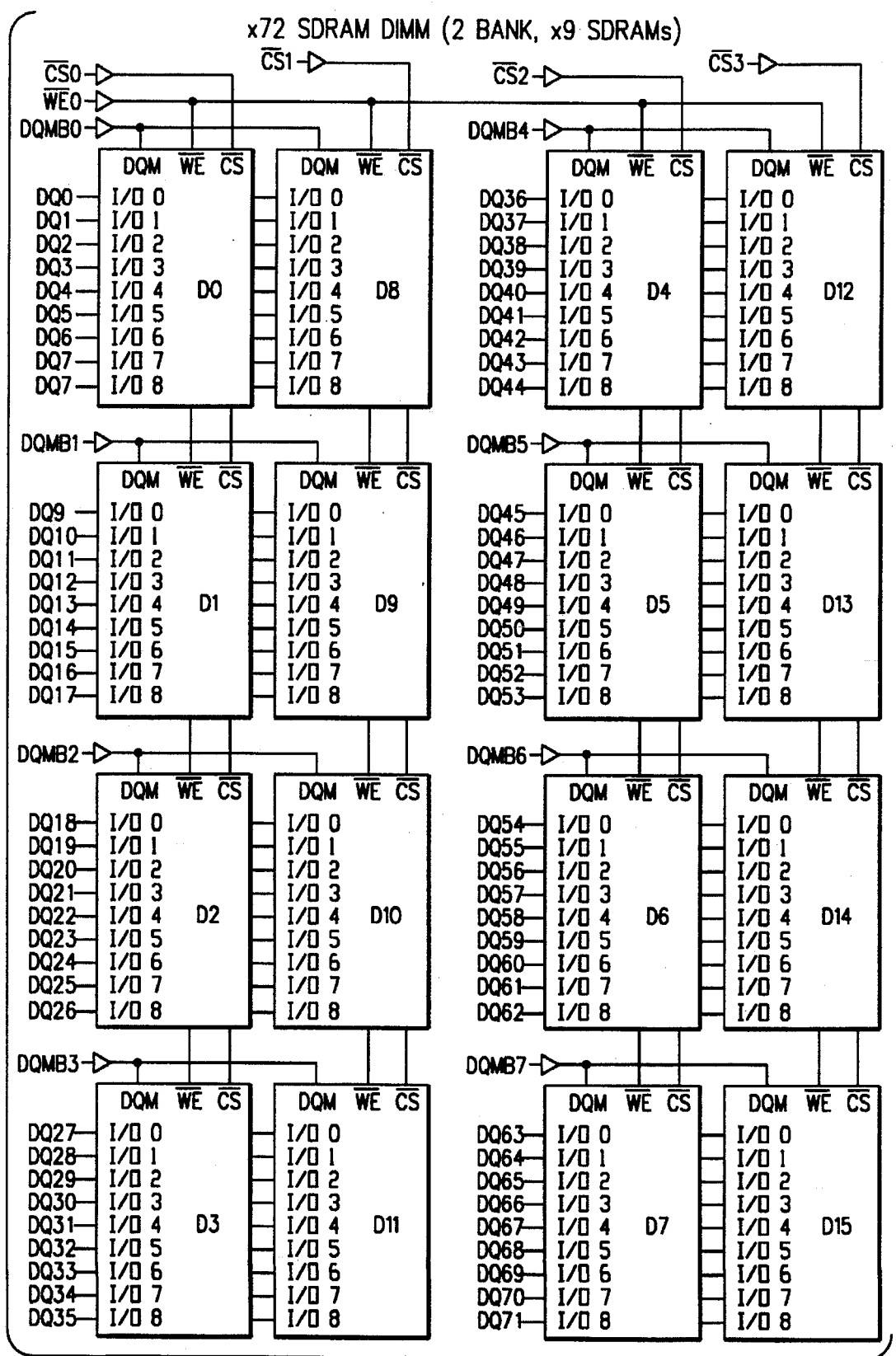
FIG. 7 is a schematic of one embodiment of a 72 bit SDRAM DIMM in accordance with the present invention.
Figure 8:
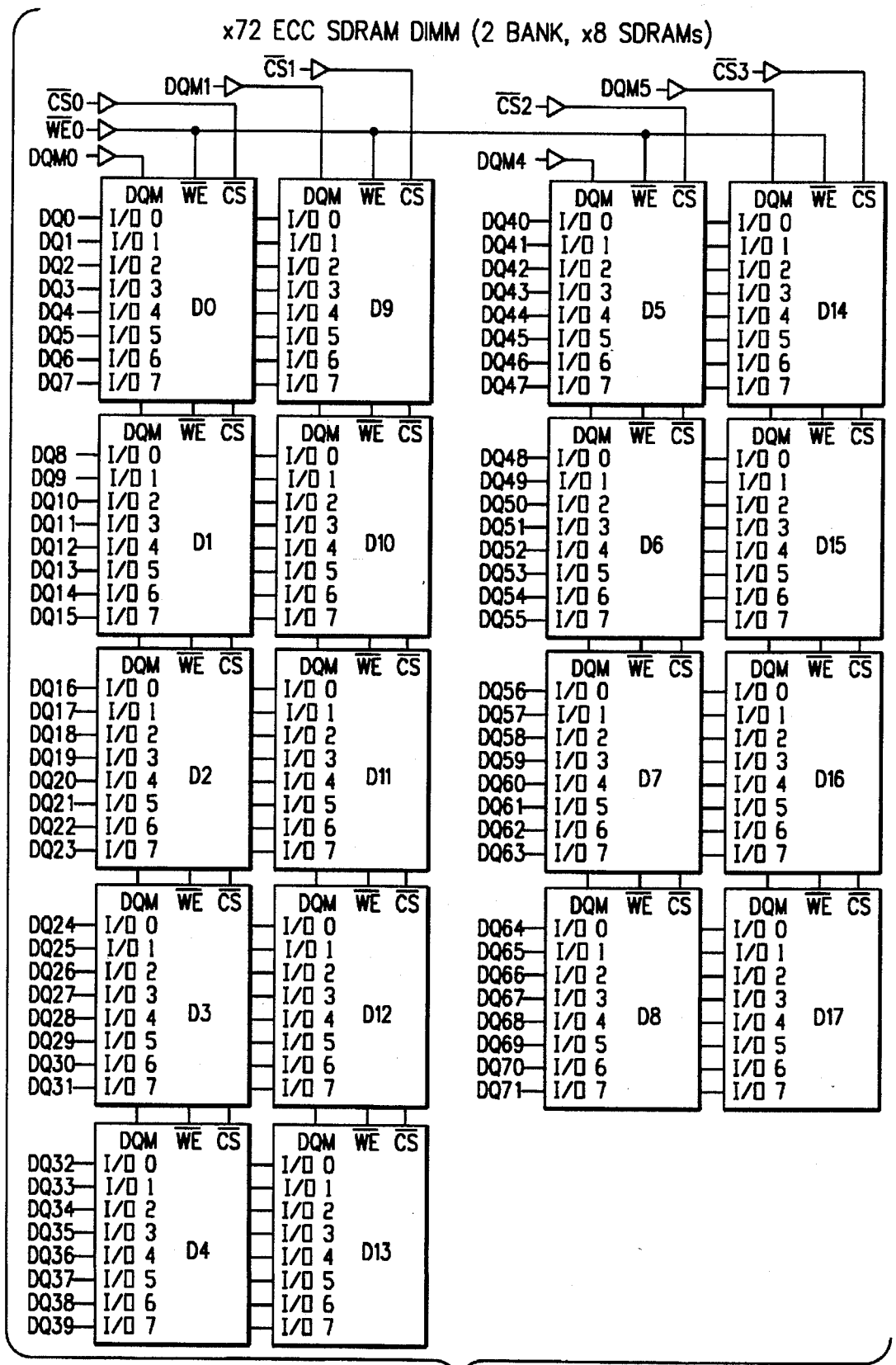
FIG. 8 is a schematic of one embodiment of a 72 bit ECC SDRAM DIMM in accordance with the present invention.
Figure 9:
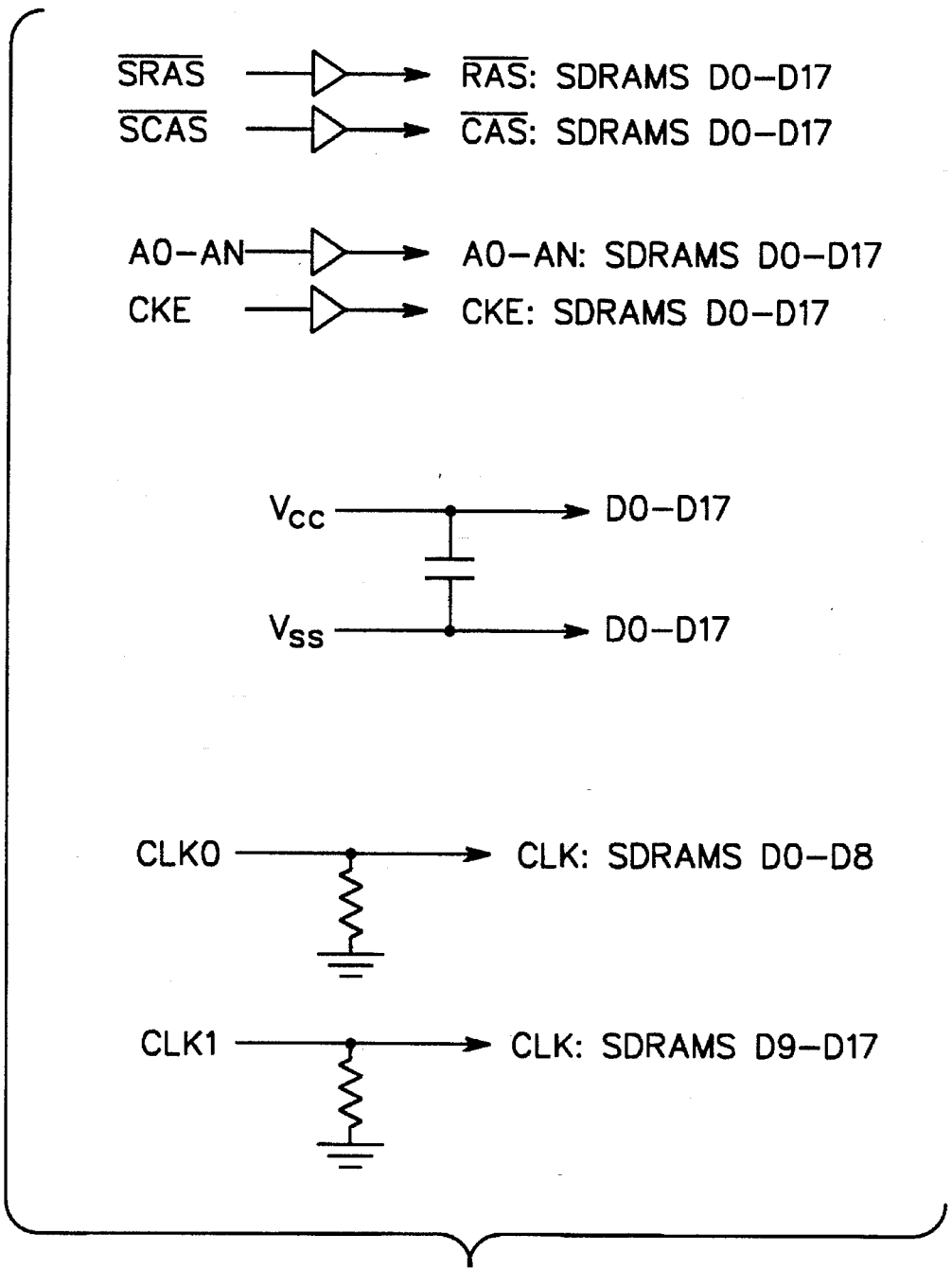
FIG. 9 schematically depicts additional pin-out connections for the 72 bit ECC SDRAM DIMM of FIG. 8.
Figure 10:
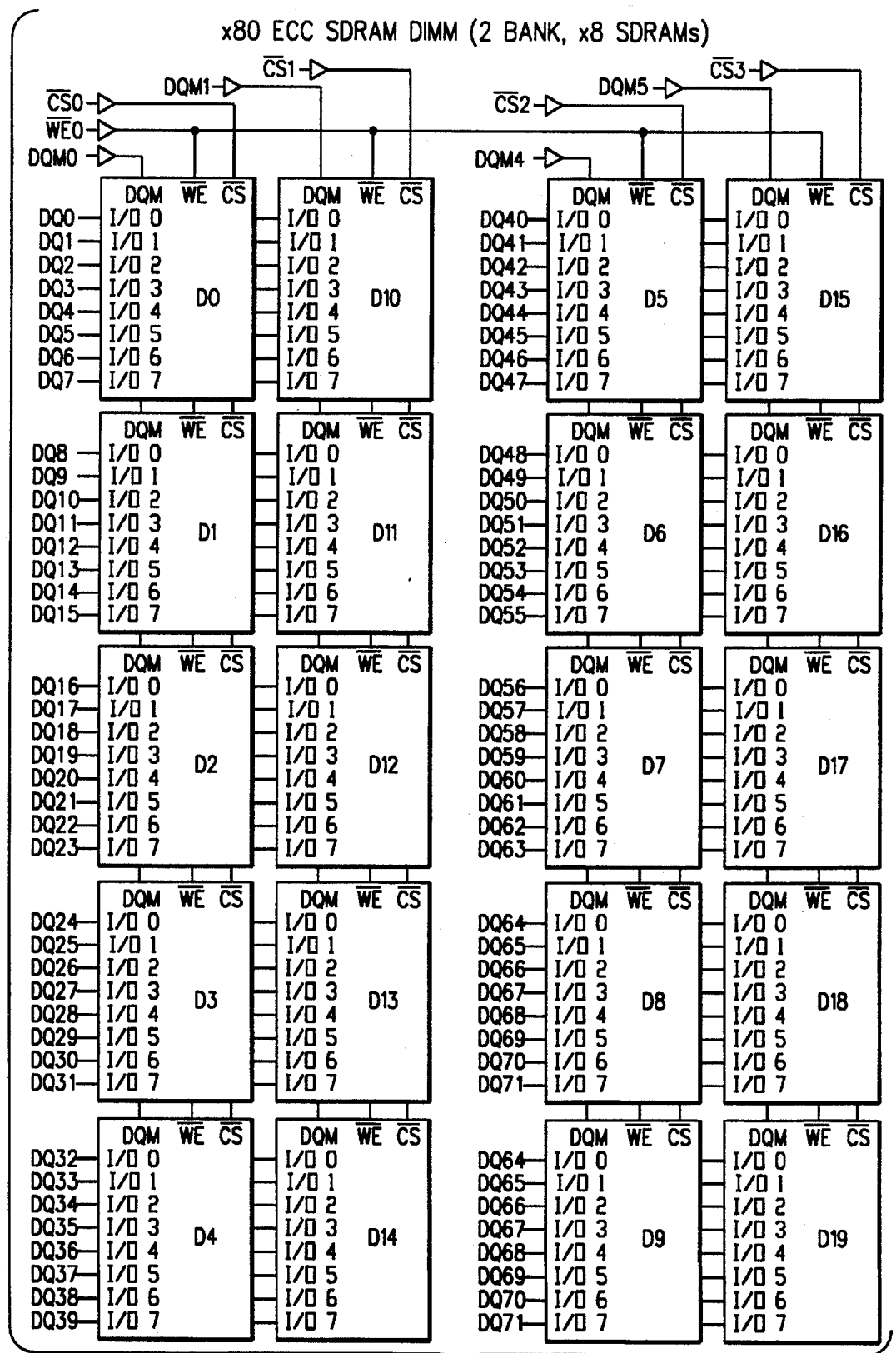
FIG. 10 is a schematic of one embodiment of a 80 bit ECC SDRAM DIMM in accordance with the present invention.

FIG. 1 is a block diagram of one embodiment of a front side and a back side of a 168 pin DIMM design for 2 meg by 8 synchronous dynamic random access memory (SDRAM) chips, D0–D8, in accordance with the present invention. SDRAM chips D0–D8 are arranged on the front and back sides of printed circuit board 10 with a corresponding buffer 12 centrally disposed on each side such that memory chips D0–D8 can be viewed as disposed on a right side and a left side of the front side and on a right side and a left side of the back side. When viewed as an assembled module, the connector pins on the front side of the DIMM are disposed along a common edge with the connector pins on the back side of the DIMM. This 168 pin DIMM preferably has a standard 5.25 inch length and a 1–1.5 inch width so that the DIMM can be accommodated within existing connectors and planars. Keys 16 provide a positive mechanical interlock for systems solely supporting DRAM or SDRAM. Systems supporting both would have no connector key in this position. A side edge key may be used to inform the controller of the type of memory technology employed, e.g., flash write, EPROM, etc.

FIGS. 2a & 2b comprise a table of JEDEC pin-out assignments for a 168 pin dynamic random access memory (DRAM) DIMM. FIG. 3 contains descriptions for various pin names used in the tables of FIGS. 2a & 2b. Additional pin names employed comprise:

CE—column enable
RE—row enable
OE—output enable

As noted initially, the 168 pin 8 byte DIMM family has been developed as an optimized low cost main memory solution for 4 and 8 byte processor applications. The family includes 64 bit non-parity, 72 bit parity, 72 bit ECC, and 80 bit ECC memory organizations.

The table of FIG. 3 introduces the various signals necessary to functionally implement a DIMM design for SDRAMs. As noted, required are: 4 chip select (CS) pins, 2 clock (CLK) pins (i.e., in one preferred embodiment), 1 clock enable (CKE) pin, 1 synchronous column address strobe (SCAS) pin, 1 synchronous row address strobe (SRAS) pin, 8 data input/output mask (DQM) pins, and optionally, 2 reference supply (Vref) pins. When used, the optional reference voltage pin obviates the need for on-chip generation of the reference voltage by the SDRAMs. Also, note that the table of FIG. 3 specifies that two connector pins are to be employed for receiving two separate clock signals. One preferred embodiment of a two clock distribution system for synchronous circuit assemblies is presented in co-pending U.S. patent application Ser. No. 08/163,447 entitled "Clock Distribution System for Synchronous Circuit Assemblies," which is commonly assigned and which is hereby incorporated herein by reference. Notwithstanding this, those skilled in the art should recognize that the concepts presented herein are equally applicable to a 1 clock pin implementation which, for example, may employ an on-board phase locked loop.

FIG. 4 presents one embodiment of possible physical pin reassignments in accordance with the present invention which modify a 168 pin DRAM DIMM to a 168 pin SDRAM DIMM, while still maintaining physical and architectural compatibility of the module with existing connectors and memory controllers. In this regard, note that Motorola, Inc. has recently announced the marketing of an MPC105 PCI Bridge/Memory Controller which is capable of supporting a variety of DRAM and SDRAM configurations as main memory in the 168 pin DIMM.

Column enable (CE0–CE7) and row enable (RE0–RE3) pins of the DRAM DIMM are respectively reassigned as data input/output mask (DQM) and chip select (CS) pins as indicated for the different memory organizations. These reassignments are possible since SDRAMs do not require the conventional column enable and row enable signals employed by a dynamic random access memory. In the non-ECC memory organizations, the column enable (CE) pins are reassigned as data input/output mask byte (DQMB) pins, while single byte writes are not possible in an ECC memory organization.

Connector pin locations 42 & 125, which are unused in the DRAM bit assignment, are assigned to receive a first clock (CLK0) and a second clock (CLK1), respectively. These pin assignments are located in the middle of the respective connector pin arrays for the front side and back side of the DIMM. In addition, clock connector pins 42 & 125 are bracketed by assigned connector pins each of which receives a power or a ground signal. In this regard, note that the pin assignments of the 168 pin DRAM DIMM of FIGS. 2a & 2b are maintained in the 168 pin SDRAM DIMM unless otherwise expressly indicated in the reassignment table of FIG. 4.

The clock enable (CKE) signal is assigned to unused pin 128 in the DRAM pin assignment configuration. Similarly, two unused connector pins of the DRAM pin assignments are employed to receive the synchronous column address strobe (SCAS) and the synchronous row address strobe (SRAS) signals, e.g., pins 111 & 115. These signals, which are referred to as CAS and RAS, respectively, within the SDRAM itself, are distinguished from the column enable and row enable signals employed in a DRAM DIMM since the SCAS and SRAS signals are only employed in an SDRAM to capture an address. The SCAS and SRAS signals are sent to all SDPAMs on the assembly. Additional reassigned pin-outs are the output enable pins OE0, OE2 and the additional address zero B0 pin, all of which become unassigned in the SDRAM DIMM pin-out configuration, i.e., don't use (DU). A DU is a pin necessarily reserved for a DRAM DIMM.

FIGS. 5–11 depict hardware implementations of selected embodiments of a 168 pin SDRAM DIMM family including a 64 bit non-parity DIMM, a 72 bit parity DIMM, a 72 bit ECC DIMM, and an 80 bit ECC DIMM, all in accordance with the present invention, and in particular, compatible with the pin reassignments of FIG. 4.

Figure 12:
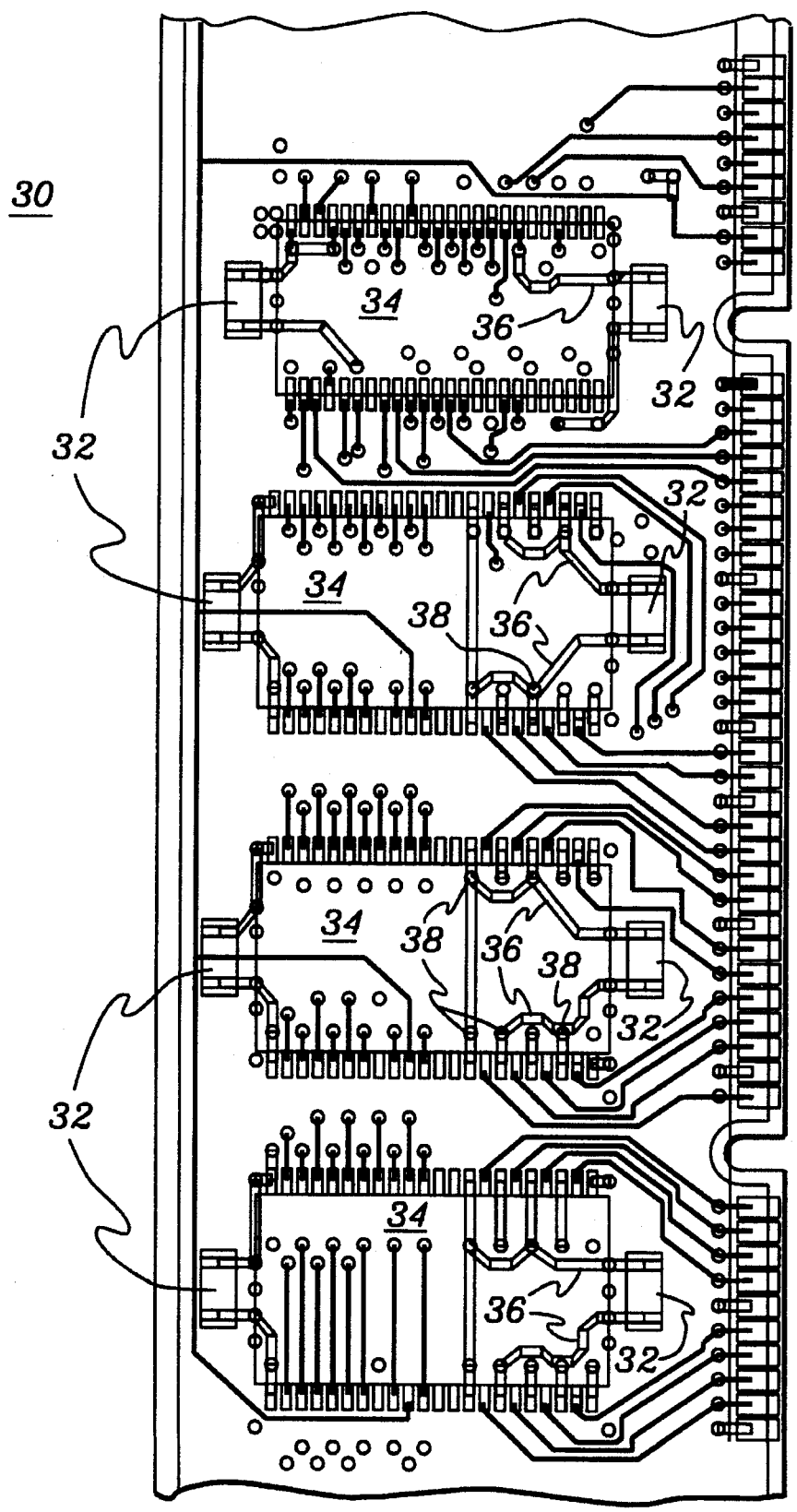
FIG. 12 is detailed, partial layout schematic of one embodiment of a 168 pin DIMM design for synchronous DRAMs having the configuration of FIG. 1.

Another feature of an SDRAM DIMM in accordance with the present invention is the special placement and wiring of decoupling capacitors around the SDRAMs and the buffer chips to reduce simultaneous switching noises during write and read operations. Simultaneous switching of off chip drivers can result in severe current changes and coupled noises. Thus, one characteristic of the present invention is the provision of two decoupling capacitors for each chip in the memory module, including buffer chips 12 (FIG. 1) as shown in the layout enlargement 30 of FIG. 12. A pair of capacitors is employed per chip due to the faster switching speed of SDRAMs compared with DRAMs. As shown, the decoupling capacitors 32 of each pair are located on opposite ends of the respective SDRAM or buffer chip 34. A first capacitor of each capacitor pair assigned to a particular chip functions as a data input/output decoupling capacitor, while a second capacitor of the pair is coupled to function as a control line and internal chip decoupling capacitor. Since input/output for data lines and control lines are typically at opposite ends of the memory chips, the decoupling capacitors 32 are also placed at opposite ends. Preferably, the SDRAMs are oriented such that the data input/output pins are closest to the connector pins of the DIMM.

A special wiring scheme for the decoupling capacitors is also used to reduce wiring inductance. High wiring inductance can seriously reduce the effectiveness of the decoupling capacitor to supply currents to the SDRAMs during simultaneous switching. More particularly, decoupling of the power and ground planes is further enhanced by employing wide width wiring 36 to electrically connect each capacitor to the respective ground and power plane. By way of example, conventional chip wiring may have a 7 mil. width while the width of the wiring from the decoupling capacitors may be three times greater, i.e., 21 mils. This increased width also lowers the inductance of lines 36. As a further enhancement, efficiency of the decoupling capacitors can be increased by connecting each wide line 36 to the respective power or ground plane through multiple via openings 38 as shown.

To restate, this invention comprises in all aspects a memory module and fabrication method for accommodating multiple synchronous memories in an in-line memory module that is physically and architecturally compatible with conventional memory modules containing multiple asynchronous memories, such as DRAMs. With compatibility, a 168 pin SDRAM DIMM can be substituted for a conventional 168 pin DRAM DIMM without any requirement that the connector, planar or memory controller be modified beyond structures presently commercially available, i.e., other than that the connector be keyless. Thus a quantum jump in memory module performance can be attained by substituting SDRAMs for DRAMs, with only a minor increase in cost.

Additionally, structures are presented herein which have a pair of decoupling capacitors for each chip in the memory module for improved decoupling capacitance. A first capacitor is configured to decouple data lines, while a second capacitor of the pair is configured to decouple control lines and internal chip circuitry. Further, wire inductance is lowered in the lines connecting the decoupling capacitors to the respective power and ground planes by provision of wide width lines each of which contacts the respective plane through multiple via openings. Lower noise and better performance can also be obtained by disposing power and ground connector pins adjacent to the synchronous clock pin(s), and positioning the two synchronous clock pins in the middle of the pin-out arrays. A family of high performance, low cost SDRAM DIMMs is presented.

The concepts disclosed herein are equally applicable to single in-line memory modules (SIMMs).

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A dual in-line memory module (DIMM) comprising:
 a printed circuit board having a front side and a back side and 168 connector pin locations corresponding to 168 pin connectors of a standard dynamic random access memory (DRAM) DIMM interface;
 multiple standard synchronous dynamic random access memories (SDRAMs) mounted on said front side and said back side of said printed circuit board; and
 means for electrically connecting said multiple SDRAMs to said 168 connector pin locations such that a functional DIMM is defined for said SDRAMs.

2. The DIMM of claim 1, wherein connector pin locations 1–84 are on the front side of said printed circuit board and connector pin locations 85–168 are on the back side of said printed circuit board, and wherein connector pin locations 42 and 125 comprise a first clock signal (CLK0) pin and a second clock signal (CLK1) pin, respectively.

3. The DIMM of claim 2, wherein assigned connector pin locations adjacent to said CLK0 pin and said CLK1 pin each comprise either a voltage pin or a ground pin.

4. The DIMM of claim 3, wherein connector pin location 41 comprises a reference voltage (Vref) pin, connector pin location 43 comprises a ground (Vss) pin, connector pin location 124 comprises a power supply voltage (Vcc) pin, connector pin location 126 is unassigned and connector pin location 127 comprises a ground (Vss) pin.

5. The DIMM of claim 1, wherein connector pin locations 1–84 are disposed on the front side of said printed circuit board and connector pin locations 85–168 are disposed on the back side of said printed circuit board, and wherein connector pin locations 28, 29, 46, 47, 112, 113, 130 & 131 comprise data input/output mask (DQM) pins.

6. The DIMM of claim 5, wherein connector pin locations 30, 45, 114 and 129 comprise chip select (CS) pins.

7. The DIMM of claim 6, wherein connector pin locations 111 and 115 comprise a synchronous column address strobe (SCAS) pin and a synchronous row address strobe (SRAS) pin, respectively.

8. The DIMM of claim 7, wherein connector pin location 42 comprises a first clock (CLK0) pin, connector pin location 125 comprises a second clock (CLK1) pin, and connector pin location 128 comprises a clock enable (CKE) pin.

9. The DIMM of claim 8, wherein the DIMM comprises one of a x64 non-parity SDRAM DIMM, a x72 parity SDRAM DIMM, a x72 ECC SDRAM DIMM, and a x80 ECC SDRAM DIMM.

10. A dual in-line memory (DIMM) module comprising:
 a printed circuit board having a first side, a second side, and a connector edge, said connector edge having a plurality of electrical contacts on said first side and said second side;
 a set of first memory elements arranged on the first side of said printed circuit board, at least some of said first memory elements having data lines and control lines coupled to selected electrical contacts of said plurality of electrical contacts on said connector edge of said printed circuit board;
 a set of second memory elements arranged on the second side of said printed circuit board, at least some of said second memory elements also having data lines and control lines coupled to selected electrical contacts of said plurality of electrical contacts on said connector edge of said printed circuit board; and
 a plurality of first capacitive means and a plurality of second capacitive means, each first capacitive means being associated with one of said at least some first memory elements and said at least some second memory elements having data lines and control lines coupled to said selected electrical contacts on said connector edge of said printed circuit board, and each second capacitive means also being associated with one of said at least some first memory elements and said at least some second memory elements having said data lines and said control lines coupled to said selected electrical contacts on said connector edge of said printed circuit board, wherein each of said at least some first memory elements and said at least some second memory elements has associated therewith both a first capacitive means and a second capacitive means, said associated first capacitive means being disposed and connected to function as a data line decoupling capacitor and said associated second capacitive means being disposed and connected to function as a control line decoupling capacitor.

11. The DIMM of claim 10, wherein each memory element of said set of first memory elements and said set of second memory elements has a first end and a second end, and wherein each first capacitive means is disposed at the first end the associated memory element and each second capacitive means is disposed at the second end of the associate memory element of said at least some first memory elements and said at least some second memory elements having associated therewith both a first capacitive means and a second capacitive means.

12. The DIMM of claim 11, further comprising a first set of electrical interconnects and a second set of electrical interconnects, said first of electrical interconnects being disposed to electrically connect said data lines and control lines of said at least some first memory elements and said at least some second memory elements to said selected electrical contacts of said plurality of electrical contacts on said connector edge of the printed circuit board, said second set of electrical interconnects being disposed to electrically connect each first capacitive means and second capacitive means to the associated one of said at least some first memory elements and said second memory elements having associated therewith both a first capacitive means and a second capacitive means, and wherein each electrical interconnect of said second set of electrical interconnects has an identical cross-sectional area and each electrical interconnect of said first set of electrical interconnects has an identical cross-sectional area, and wherein the cross-sectional area of the electrical interconnects of the second set of electrical interconnects is greater than the cross-sectional area of the electrical interconnects in the first set of electrical interconnects.

13. The DIMM of claim 12, wherein the cross-sectional area of the electrical interconnects in said second set of electrical interconnects is approximately 3 times larger than the cross-sectional area of the electrical interconnects in said first set of electrical interconnects.

14. The DIMM of claim 13, wherein at least some of the electrical interconnects of said second set of electrical interconnects connect to the associated memory element at multiple contact points such that wiring inductance is reduced.

15. The DIMM of claim 10, wherein said first memory elements and said second memory elements comprise synchronous dynamic random access memories (SDRAMs).

16. The DIMM of claim 15, wherein the DIMM comprises one of a x64 non-parity SDRAM DIMM, a x72 parity SDRAM DIMM, a x72 ECC SDRAM DIMM and a x80 ECC SDRAM DIMM.

17. A single in-line memory module (SIMM) comprising:
    a printed circuit board having a planar surface and a connector edge, said connector edge having a plurality of electrical contacts;
    a set of memory elements arranged on the planar surface of the printed circuit board, at least some of the memory elements having data lines and control lines coupled to selected electrical contacts of the plurality of electrical contacts on the connector edge of the printed circuit board; and
    a plurality of first capacitive means and a plurality of second capacitive means, each first capacitive means being associated with one of said at least some memory elements having data lines and control lines coupled to said selected electrical contacts on the connector edge of the printed circuit board, and each second capacitive means also being associated with one of the at least some memory elements having data lines and control lines coupled to the selected electrical contacts on the connector edge of the printed circuit board, wherein each of said at least some memory elements has associated therewith a first capacitive means of said plurality of first capacitive means and a second capacitive means of said plurality of second capacitive means, each associated first capacitive means being disposed and connected to function as a data line decoupling capacitor and each associated second capacitive means being disposed and connected to function as a control line decoupling capacitor.

18. The SIMM of claim 17, wherein said memory elements comprise synchronous dynamic random access memories (SDRAMs).

19. The SIMM of claim 18, where each memory element has a first end and a second end, and wherein each first capacitive means is disposed at the first of the associated memory element and each second capacitive means is disposed at the second ends of the associated memory element and each second capacitive means is disposed at the second end of the associated memory element.

20. A method for defining an "x" pin dual in-line memory module (DIMM) for synchronous dynamic random access memories (SDRAMs) from a standard "x" pin DIMM for dynamic random access memories (DRAMs) having column enable (CE) and row enable (RE) pins, said method comprising the steps of:
    (a) reassigning column enable (CE) pins and row enable (RE) pins of said "x" pin DIMM design for DRAMs to data input/output mask (DQMs) pins and chip select (CS) pins, respectively;
    (b) reassigning at least one pin of said "x" pin DIMM design for DRAMs to comprise a synchronous clock (CLK) pin; and
    (c) reassigning at least one pin of said "x" pin DIMM design for DRAMs to comprise a synchronous column address strobe (SCAS) pin and one pin of said "x" pin DIMM design for DRAMs to comprise a synchronous row address strobe (SRAS) pin,
wherein upon completion of said steps (a)–(c) a functional "x" pin DIMM design for SDRAMs is defined from the standard "x" pin DIMM design for DRAMs.

21. The method of claim 20, wherein "x" equals 168 such that said method comprises defining a 168 pin SDRAM DIMM from a 168 DRAM DIMM, and wherein said reassigning step (b) includes assigning a first unassigned pin of said 168 DRAM DIMM to comprise a first synchronous clock (CLK0) pin, assigning a second unassigned pin of said 168 DRAM DIMM to comprise a second synchronous clock (CLK1) pin, and assigning a third unassigned pin of said 168 pin DRAM DIMM to comprise a clock enable (CLKE) pin.

22. The method of claim 21, wherein said 168 pin DRAM DIMM includes pins 1–84 disposed on a first side of a printed circuit board and pins 85–168 disposed on a second side of the printed circuit board, and wherein said reassigning step (b) includes assigning pins 42 and 125 to comprise the first synchronous clock (CLK0) and second synchronous clock (CLK1) pin, respectively.

23. The method of claim 20, further comprising the step of providing a first capacitor and a second capacitor pair in association with each SDRAM of the "x" pin SRAM DIMM formed from the standard "x" pin DRAM DIMM, the first capacitor and the second capacitor of each first capacitor and second capacitor pair comprising decoupling capacitors connected to function as a data line decoupling capacitor and a control line decoupling capacitor.

24. The SDRAM DIMM of claim 1, wherein data input/output mask (DQM) lines of said SDRAMs are assigned to pins corresponding to column enable (CE) pin connectors of said 168 pin DRAM DIMM connector.

25. The SDRAM DIMM of claim 23, wherein chip select (CS) lines of said SDRAMs are assigned to pins corresponding to row enable (RE) pin connectors of said 168 pin DRAM DIMM connector.

* * * * *

Disclaimer 5,513,135—Timothy J. Dell Colchester; Lina S. Farah, Burlington; George C. Feng; Mark W. Kellogg, both of Essex Junction, all of Vt. SYNCHROUNOUS MEMORY PACKAGED IN SINGLE/DUAL IN-LINE MEMORY MODULE AND METHOD OF FABRICAITON. Patent dated April 30, 1996. Disclaimer filed February 11, 2003 by assignee, International Business Machines Corporation.

Herby enters this disclaimer to claims 1-25 of said patent.

*(Official Gazette, July 15, 2003)*